(12) United States Patent
Carman et al.

(10) Patent No.: US 8,484,521 B2
(45) Date of Patent: Jul. 9, 2013

(54) FIRMWARE MONITORING OF MEMORY SCRUB COVERAGE

(75) Inventors: Jay W. Carman, Austin, TX (US); Marc A. Gollub, Round Rock, TX (US); Anshuman Khandual, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 270 days.

(21) Appl. No.: 13/081,627

(22) Filed: Apr. 7, 2011

(65) Prior Publication Data

US 2012/0260139 A1    Oct. 11, 2012

(51) Int. Cl.
*G11C 29/00* (2006.01)

(52) U.S. Cl.
USPC ..................... 714/723; 365/185.11

(58) Field of Classification Search
USPC ..................... 714/723; 365/185.11
See application file for complete search history.

(56) References Cited

U.S. PATENT DOCUMENTS

| 7,194,660 B2 | 3/2007 | Edrich |
| 2005/0073884 A1* | 4/2005 | Gonzalez et al. ........ 365/185.02 |

* cited by examiner

*Primary Examiner* — Sam Rizk
(74) *Attorney, Agent, or Firm* — Stephen R. Tkacs; Stephen J. Walder, Jr.; Libby Z. Toub

(57) ABSTRACT

Mechanisms are provided in which firmware verifies he entire system's memory scrub coverage through some additional memory controller (MC) registers/attentions and builds up a processor runtime diagnostic (PRD) scrub coverage table during every scrub cycle. Firmware may go through the scrub coverage table rank-by-rank on a periodic basis to determine whether any ranks had not been covered by hardware scrubbing. Firmware may initiate a targeted scrub and diagnostic for all of the ranks that did not have adequate scrub coverage. If for some reason the system still has some memory ranks that have not been covered by the initial hardware scrub and the targeted scrub, then the firmware may perform some course of action for fault isolation.

20 Claims, 8 Drawing Sheets

PRD INITIATED TARGETED DIAGNOSTICS

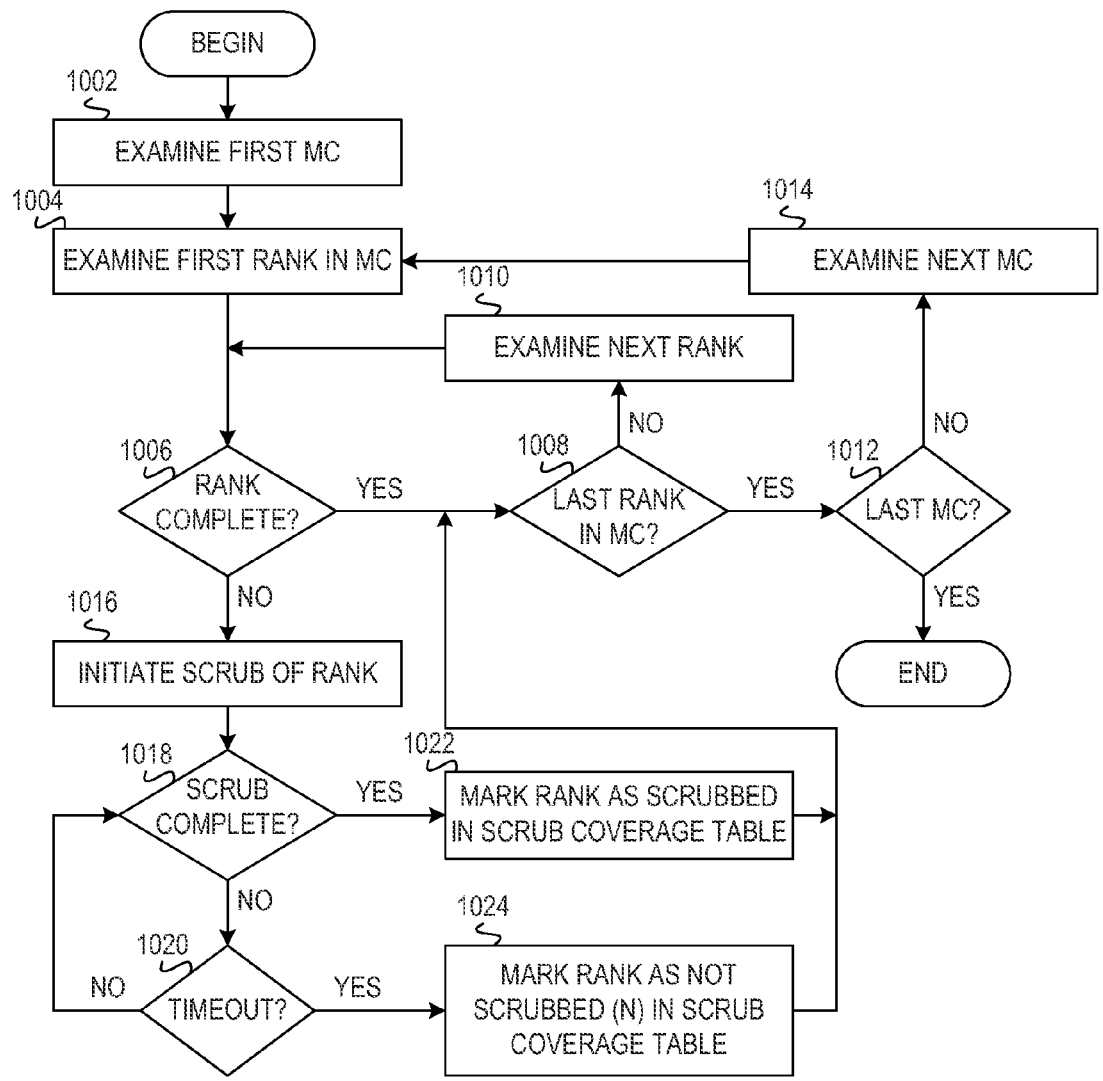

FIRMWARE MONITORING OF MEMORY SCRUB COVERAGE

BACKGROUND

The present application relates generally to an improved data processing apparatus and method and more specifically to mechanisms for firmware monitoring of memory scrub coverage and related firmware fault isolation techniques.

Memory scrubbing is the process of detecting and correcting bit errors in memory by using error-detecting codes like error correction code (ECC). Due to the high integration density of contemporary computer memory chips, individual memory cell structures have become small enough to be vulnerable to cosmic rays and/or alpha particle emission. The errors caused by these phenomena are called soft errors. The probability of a soft error at any individual memory bit is very small. However, together with the large amount of memory with which computers—especially servers—are equipped and perhaps several months of uptime, the probability of soft errors in the total memory installed becomes significant.

The information in an FCC memory is stored redundantly enough to correct single bit error per memory word. An FCC memory can support the scrubbing of the memory content. If the memory controller scans systematically through the memory, the single bit errors can be detected, the erroneous bit can be determined using the ECC checksum, and the corrected data can be written back to the memory.

It is important to check each memory location periodically before multiple bit errors within the same word are likely to occur, because while one-bit errors can be corrected, multiple-bit errors are not correctable, in the case of typical ECC memory modules. Currently, there is no way to verify whether a hardware scrub, (performed by maintenance logic in a memory controller) has gone through all memory addresses in a system during a memory scrub cycle. In practice, a hardware scrub may hang or get stuck in a loop due to various hardware and firmware defects. During these situations, firmware assumes that the hardware scrub is running without error and is still scrubbing the directed address ranges in memory.

Three critical problems can arise because of failure of a memory scrub to detect potentially fatal memory errors on a given rank when firmware thinks that the hardware has scrubbed on a rank while the scrub never completed through the rank because of some problem. Failure of a scrub to fix soft single cell errors means there is a risk of those errors accumulating over time and lining up to become an unrecoverable error (UE). Also, the scrub may fail to detect errors that could otherwise be repaired via chip/symbol marking or dynamic random access memory (DRAM) steering resulting in UEs. In addition, the scrub may fail to detect UEs that could otherwise be logical memory block (LMB) garded by virtualization to prevent an operating system (OS) or application crash.

Currently, if a scrub does not detect a fatal memory error, the most likely place for the error to be caught is when the virtualization layer, the operating system kernel, or an application tries to access the affected memory location. When that happens, the system is exposed to an application, operating system kernel, or virtualization layer crash. The only way to prevent the crash of the system is to enable memory mirroring for all memory locations.

However, memory mirroring is expensive in terms of implementation and resources being used during mirrored operations. This added redundancy negatively impacts performance. In cases where only the virtualization layer is mirrored, then the operating system kernel and applications are still vulnerable to undetected, potentially fatal memory errors.

SUMMARY

In one illustrative embodiment, a method, in a data processing system, is provided for monitoring memory scrub coverage. The method comprises initiating a hardware memory scrub cycle for performing a hardware memory scrub of a memory comprising at least one configured memory controller. Each memory controller is associated with a memory having a plurality of ranks. The method further comprises building a scrub coverage table for the at least one memory controller and the plurality of rank of the at least one configured memory controller by storing, for each rank for which the hardware memory scrub did successfully complete, an indication that the rank is scrubbed and storing, for each rank for which the hardware memory scrub did not successfully complete, an indication that the rank is not yet scrubbed. The method further comprises initiating a targeted scrub diagnostic for performing a targeted hardware memory scrub of each rank having an indication that the rank is not yet scrubbed in the scrub coverage table. The method further comprises updating the scrub coverage table by storing, for each successful rank for which the targeted hardware memory scrub did successfully complete, an indication that the successful rank is scrubbed and storing, for each unsuccessful rank for which the targeted hardware memory scrub did not successfully complete before a timeout condition, an indication that the unsuccessful rank is not scrubbed after the targeted hardware memory scrub.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 10 is a flowchart illustrating operation of a processor runtime diagnostic for performing a targeted memory scrub diagnostic in accordance with an illustrative embodiment.

DETAILED DESCRIPTION

The illustrative embodiments provide a mechanism in which firmware verities the entire system's memory scrub coverage through some additional memory controller (MC) registers/attentions and builds up a processor runtime diagnostic (PRD) scrub coverage table during every scrub cycle. Firmware may go through the scrub coverage table rank-by-rank on a periodic basis to determine whether any ranks had not been covered by hardware scrubbing. Firmware initiates a targeted scrub and diagnostic for all of the ranks that did not have adequate scrub coverage. If the hardware scrub is able to get through a given rank during a targeted scrub, the firmware marks the rank as scrubbed in the PRD scrub coverage table. If for some reason the system still has some memory ranks that have not been covered by the initial hardware scrub and the targeted scrub, then the firmware may perform some course of action for fault isolation. One solution is for the firmware to communicate the address ranges to a virtualization layer to take corrective actions, such as migrating a partition away from the memory and ensuring the memory cannot be assigned to a partition in the future. Another solution is to stop hardware scrubbing on that particular memory controller and initiate virtualization layer-assisted scrubbing.

Figure 1:
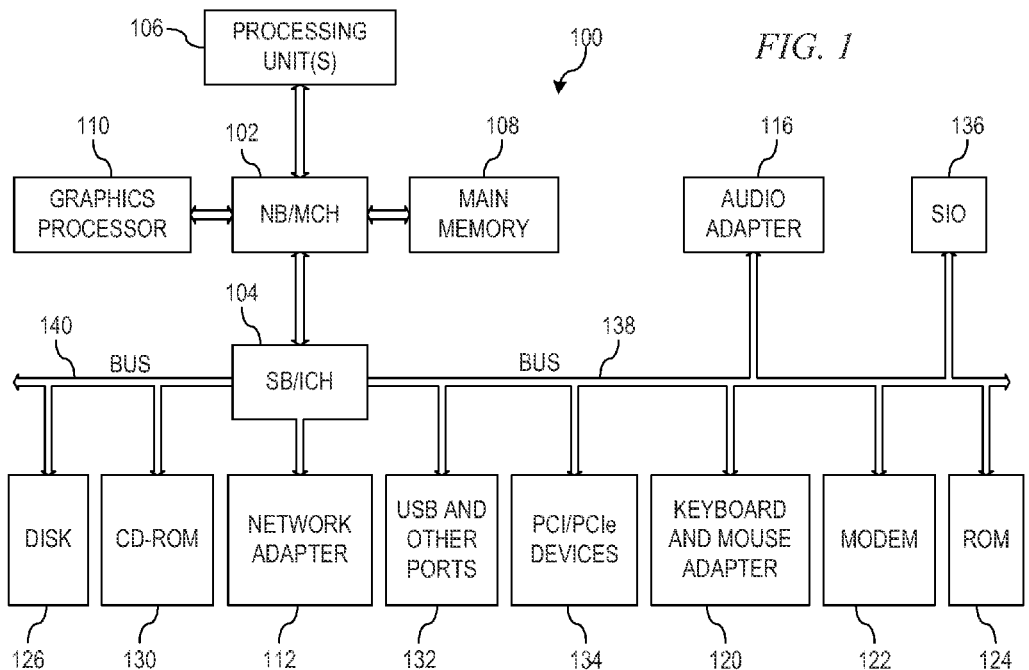
FIG. 1 is a block diagram of an example data processing system in which aspects of the illustrative embodiments may be implemented.

The illustrative embodiments may be utilized in many different types of data processing environments including a distributed data processing environment, a single data processing device, or the like. In order to provide a context for the description of the specific elements and functionality of the illustrative embodiments, FIG. 1 is provided hereafter as an example environment in which aspects of the illustrative embodiments may be implemented, It should be appreciated that FIG. 1 is only an example and is not intended to assert or imply any limitation with regard to the environments in which aspects or embodiments of the present invention may be implemented. Many modifications to the depicted environments may be made without departing from the spirit and scope of the present invention.

FIG. 1 is a block diagram of an example data processing system in which aspects of the illustrative embodiments may be implemented. Data processing system 100 is an example of a computer, such as a server, in which computer usable code or instructions implementing the processes for illustrative embodiments of the present invention may be located.

In the depicted example, data processing system 100 employs a hub architecture including north bridge and memory controller hub (NB/MCH) 102 and south bridge and input/output (I/O) controller hub (SB/ICH) 104, Processing unit 106, main memory 108, and graphics processor 110 are connected to NR/MCH 102. Graphics processor 110 may be connected to NR/MCH 102 through an accelerated graphics port (AGP).

In the depicted example, local area network (LAN) adapter 112 connects to SB/ICH 104. Audio adapter 116, keyboard and mouse adapter 120, modem 122, read only memory (ROM) 124, hard disk drive (HDD) 126, CD-ROM drive 130, universal serial bus (USB) ports and other communication ports 132, and PCI/PCIe devices 134 connect to SB/ICH 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash basic input/output system (BIOS).

HDD 126 and CD-ROM drive 130 connect to SB/ICH 104 through bus 140. HDD 126 and CD-ROM drive 130 may use, for example, an integrated drive electronics (IDE) or serial advanced technology attachment (SATA) interface. Super I/O (SIO) device 136 may be connected to SB/ICH 104.

An operating system runs on processing unit 106. The operating system coordinates and provides control of various components within the data processing system 100 in FIG. 1. As a client, the operating system may be a commercially available operating system such as Microsoft Windows 7 (Microsoft and Windows are trademarks of Microsoft Corporation in the United States, other countries, or both). An object-oriented programming system, such as the Java programming system, may run in conjunction with the operating system and provides calls to the operating system from Java programs or applications executing on data processing system 100 (Java is a trademark of Oracle and/or its affiliates.).

As a server, data processing system 100 may be, for example, an IBM® eServer™System p® computer system, running the Advanced interactive Executive (AIX®) operating system or the LINUX operating system (IBM, eServer, System p, and AIX are trademarks of International Business Machines Corporation in the United States, other countries, or both, and LINUX is a registered trademark of Linus Torvalds in the United States, other countries, or both). Data processing system 100 may be a symmetric multiprocessor (SMP) system including a plurality of processors in processing unit 106. Alternatively, a single processor system may be employed.

Instructions for the operating system, the object-oriented programming system, and applications or programs are located on storage devices, such as HDD 126, and may be loaded into main memory 108 for execution by processing unit 106. The processes for illustrative embodiments of the present invention may be performed by processing unit 106 using computer usable program code, which may be located in a memory such as, for example, main memory 108, ROM 124, or in one or more peripheral devices 126 and 130, for example.

A bus system, such as bus 138 or bus 140 as shown in FIG. 1, may be comprised of one or more buses. Of course, the bus system may be implemented using any type of communication fabric or architecture that provides for a transfer of data between different components or devices attached to the fabric or architecture. A communication unit, such as modem 122 or network adapter 112 of FIG. 1, may include one or more devices used to transmit and receive data. A memory may be, for example, main memory 108, ROM 124, or a cache such as found in NB/MCH 102 in FIG. 1.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system, other than the SMP system mentioned previously, without departing from the spirit and scope of the present invention.

Moreover, the data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device which is configured with flash memory to provide non-volatile memory for storing operating system files and/or user-generated data, for example. Essentially, data processing system 100 may be any known or later developed data processing system without architectural limitation.

The illustrative embodiments provide mechanisms for firmware monitoring of memory scrub coverage and related firmware fault isolation techniques. The embodiments extend the existing concept of 12-hour scrub cycle, for example, with some changes. That is, a typical scrub cycle is 12 hours, meaning the memory controller hardware/firmware scrubs all of the server memory in within a 12-hour time period. While this is provided as an example of a typical memory scrub cycle, the actual length of the memory scrub cycle may vary depending upon the implementation. The scrub cycle does not change where processor runtime diagnostic (PRD) initiated memory controller (MC) maintenance commands scrub the entire server memory once every 12 hours, for instance. However, the embodiments provide significant changes to the regular scrub cycle.

Figure 2:
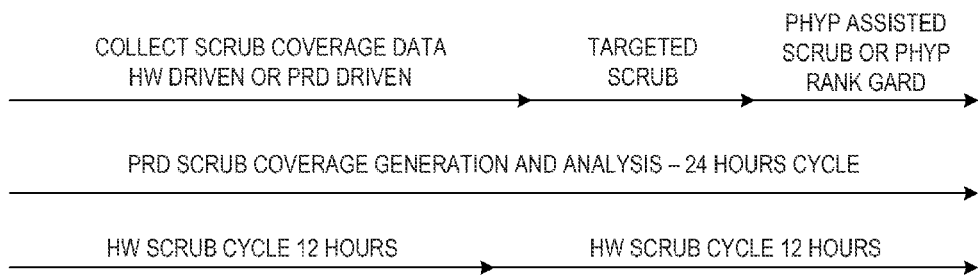
FIG. 2 is a diagram illustrating the scrub cycle for firmware monitoring of memory scrub coverage and related firmware fault isolation techniques in accordance with an illustrative embodiment.

FIG. 2 is a diagram illustrating the scrub cycle for firmware monitoring of memory scrub coverage and related firmware fault isolation techniques in accordance with an illustrative embodiment. The PRD periodically looks for scrub coverage data throughout the scrub cycle and creates a PRD scrub status table. At the end of the scrub cycle, PRD goes through the entire scrub status table and initiates a targeted scrub for ranks that scrub has not covered, to attempt to achieve complete scrub coverage of the system. The PRD communicates to the virtualization layer, such as a Power Hypervisor (PHYP), any problematic ranks whose scrub status cannot be determined.

It should be noted that acronyms and terms used in this disclosure may be specific to particular IBM systems and memory hardware and firmware technologies. However, a person of ordinary skill in the art will recognize that the techniques, concepts, and inventive aspects of the illustrative embodiments may be applied to other existing and to-be-developed systems and memory hardware and firmware technologies.

In one illustrative embodiment, a mechanism is provided to track scrub coverage directly from hardware register values, not from processor runtime diagnostic (PRD) initiated scrub commands. In the event that hardware scrub has not gotten completely through a particular rank for any reason, PRD may detect this through hardware register values and take appropriate action. For example, a memory controller maintenance command address (MCMACA) register tracks the physical memory address used by the memory controller (MC) maintenance logic. The PRD may use this register to determine which ranks have been fully covered during a scrub cycle. The MCMACA register has fields, such as rank, bank, row, and column that define the physical memory addresses. In one embodiment, the granularity of this solution is rank; therefore, any change in MCMACA[rank] can be tracked. In alternative embodiments, the mechanism may determine scrub coverage at different granularities, such as bank or row.

In the embodiments described herein, the mechanism tracks scrub coverage by accounting for changes in MCMACA[rank] value where the changes of rank are hardware maintained or global firmware (GFW) maintained. The PRD drives the MC scrub engine with granularity of rank at any point of time. To track whether or not scrub has successfully made it through an entire rank, the hardware logic may have a bank counter that gets reset every time there is a change in rank value in the MCMACA register. In the hardware maintained embodiment, the hardware updates a memory controller scrub status (MCSCRSTAT) register when the bank counter value reaches the high bank value (i.e., 111) for any given rank value in the MCMACA register for any given rank value in the MCMACA register. This ensures that all the banks within a rank have been scrubbed before the PRD updates that rank for successful scrub coverage in the scrub coverage table. In the GFW maintained embodiment, the memory control hardware may trigger successful rank coverage with a memory controller fault isolation register (MC-FIR) attention.

Figure 3:
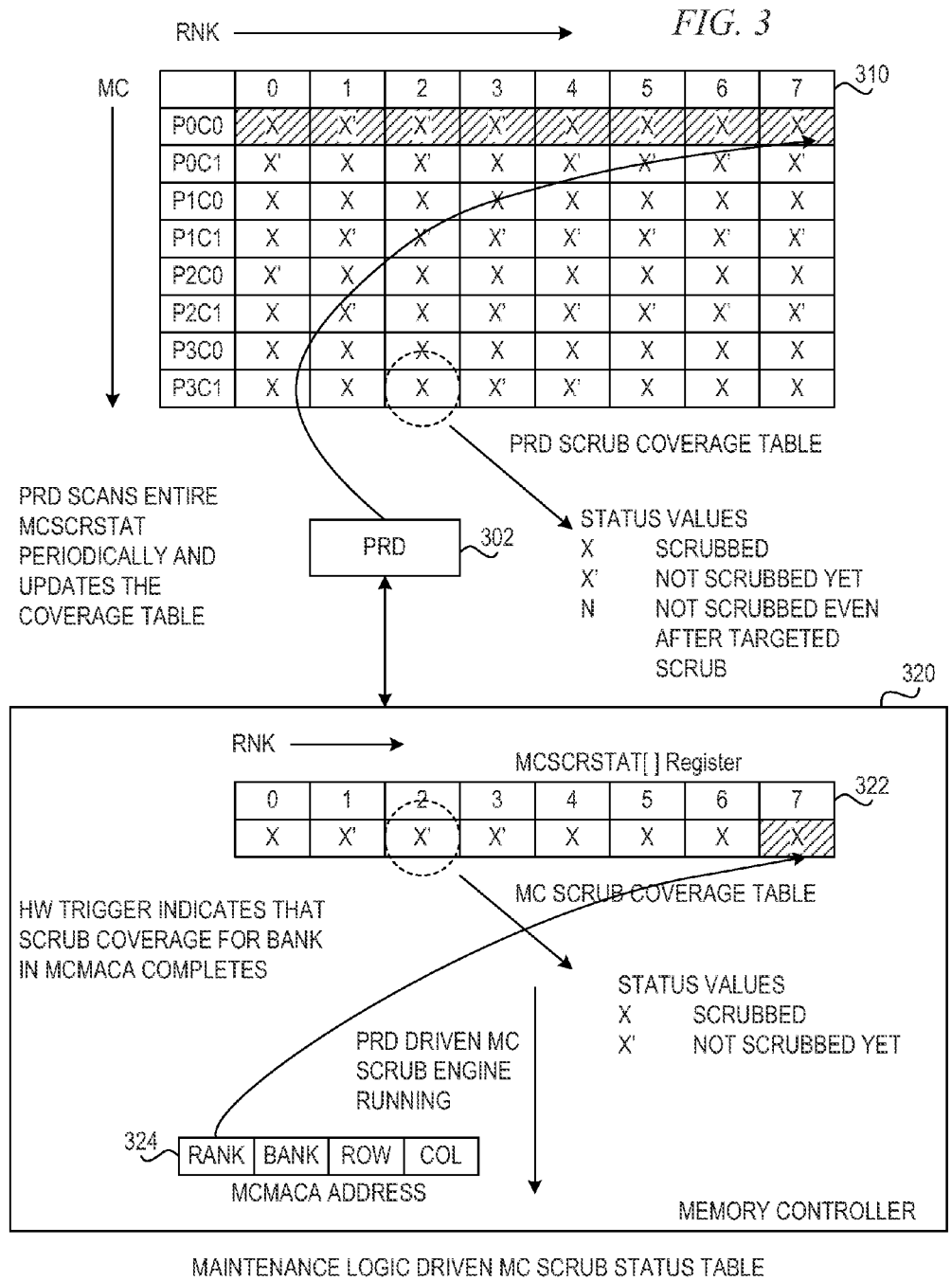
FIG. 3 is a diagram illustrating monitoring of memory scrub coverage with a hardware maintained memory controller scrub status table in accordance with an illustrative embodiment.

FIG. 3 is a diagram illustrating monitoring of memory scrub coverage with a hardware maintained memory controller scrub status table in accordance with an illustrative embodiment. Each memory controller 320 includes a memory controller scrub status (MCSCRSTAT) register that tracks whether any rank has been covered during a scrub cycle.

MCSCRSTAT[rank_#]=1 may indicate that memory scrubbing is completed for rank_#.

MCSCRSTAT[rank_#]=0 may indicate that memory scrubbing is not completed for rank_#.

MCSCRSTAT must be cleared by processor runtime diagnostic (PRD) 302 at the end of each scrub cycle. Memory controller 320 has the responsibility to update MCSCRSTAT register 322 when there is a change in rank value in MCMACA register 324. In a PRD driven scrub environment, values of MCMACA register 324 change as columns, rows, banks, and ranks are scrubbed. Any particular value of MCMACA[rank] indicates that a memory scrub is passing through that rank. Each bit in MCSCRSTAT corresponds to a respective rank. During a memory scrub, each time MCMACA[bank] reaches a maximum value followed by a change in MCMACA[rank] from rank_# to rank_#+1, the hardware of memory controller 320 recognizes that the scrub of the rank (rank_#) completed and updates the bit in MCSCRSTAT corresponding to rank_#, i.e., MCSCRSTAT[rank_#].

At the end of a scrub cycle, PRD 302 simply reads from MCSCRSTAT to determine which ranks have been covered by the memory scrub and changes the appropriate values in PRD scrub coverage table 310. In a memory scrub cycle, PRD 302 goes through each configured memory controller in the system, reads each MCSCRSTAT register, and creates PRD scrub coverage table 310 based on those values. In the example depicted in FIG. 3, for memory controller 320, PRD 302 determines that ranks 0, 4, 5, 6, and 7 were scrubbed and ranks 1, 2, and 3 were not scrubbed. In PRD scrub coverage table 310, a rank may have a status of scrubbed (X), not scrubbed yet (X'), or as will be described in further detail below, not scrubbed even after targeted scrub (N).

Maintaining a scrub status register array per memory controller is expensive in terms of hardware design and chip layout. However the scrub status register array provides great performance advantages, because the number of reads required to create PRD scrub coverage table 310 is very low.

Figure 4:
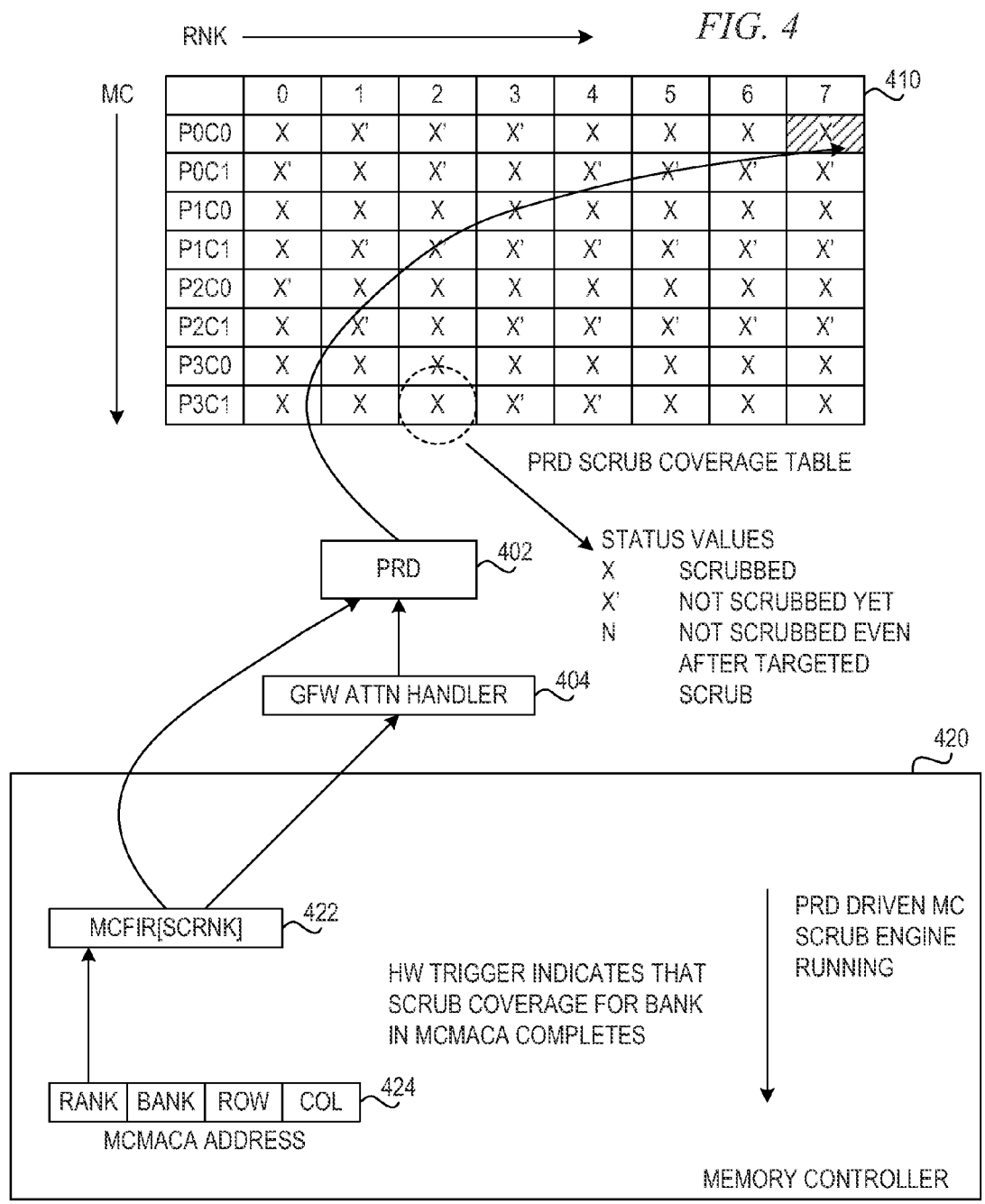
FIG. 4 is a diagram illustrating monitoring of memory scrub coverage with global firmware maintained memory controller scrub status table in accordance with an illustrative embodiment.

FIG. 4 is a diagram illustrating monitoring of memory scrub coverage with global firmware maintained memory controller scrub status table in accordance with an illustrative embodiment. PRD 402 may initiate scrub coverage table 410 to indicate that every rank has not been scrubbed yet (X'). As in the previous embodiment, processor runtime diagnostic (PRD) 402 performs a memory scrub on memory controller 420, which includes a memory controller maintenance command address (MCMACA) register 424 that tracks the physical memory address used by the memory controller (MC) 420 maintenance logic. Memory controller 420 also includes memory controller fault isolation register (MCFIR) with a scrub rank (SCRNK) component or bit 422.

Responsive to a change in rank value in MCMACA register 424, the hardware of memory controller 420 updates MCFIR [SCRNK] 422. Global firmware (GFW) attention handler 404 invokes a PRD function to handle the attention of MCFIR [SCRNK] every time the hardware of memory controller 420 updates MCFIR[SCRNK] to indicate a rank has been successfully scrubbed. PRD 402 then reads MCMACA register 424 to determine the rank that has been successfully updated, PRD 402 may then change the value for that rank in scrub coverage table 410 to indicate that the rank has been successfully updated (X). Eventually, attentions from all memory controllers for all successfully scrubbed ranks will drive creation of PRD scrub coverage table 410.

This GFW maintained implementation is relatively simple and less expensive, because it adds only one portion (e.g., one bit) to MCFIR 422. The primary cost is that PRD 402 must respond to an attention every time there is a change in the rank value of MCMACA register 424, which is quite frequent as memory scrubbing goes through all memory controllers configured in the system. This may engage PRD 402 to handle the rank change attentions excessively, which may have some impact on PRD performance.

At the end of a scrub cycle, the PRD driven memory controller scrub engine is supposed to have covered the entire configured memory of the system. The value for every rank in the PRD scrub status table is either scrubbed (X) or not scrubbed yet (X').

Figure 5:
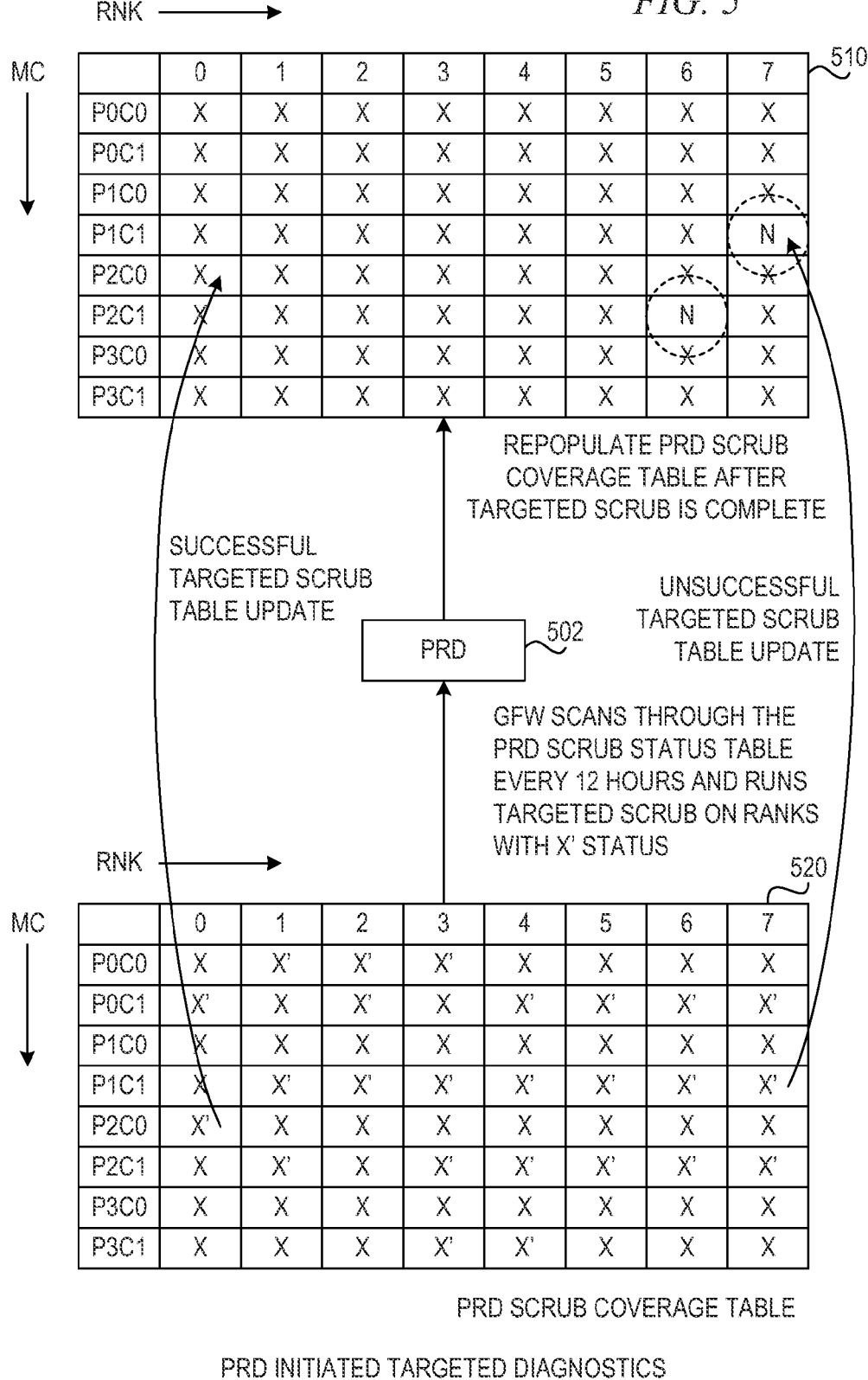
FIG. 5 is a diagram illustrating operation of a targeted diagnostic in accordance with an illustrative embodiment.

FIG. 5 is a diagram illustrating operation of a targeted diagnostic in accordance with an illustrative embodiment. Global firmware (GFW) goes through the entire scrub status table 520 rank by rank sequentially. If a given rank is not scrubbed yet (X'), PRD 502 kicks off a targeted scrub on that rank. If the scrub successfully increments through all banks within the rank, then PRD 502 updates the scrub coverage table for that rank to indicate that it has been scrubbed (X). If for some reason the scrub is unable to increment through all banks within the rank before some timeout, PRD 502 updates the scrub coverage table for that rank to indicate that it is not scrubbed even after targeted scrub (N).

The resulting scrub table after targeted scrub is shown as repopulated PRD scrub coverage table 510. All ranks in PRD scrub coverage table 510 should have a value of scrubbed (X) or not scrubbed even after targeted scrub (N). A rank with a status of "N" indicates that the PRD 502 is unable to determine successful hardware scrub of the rank, which may expose any reads from this address range to memory errors, as previously explained.

After the targeted diagnostic phase is completed, there still may be some ranks whose hardware scrub coverage status cannot be determined. In one embodiment, a rank gard isolates those ranks. In another embodiment, a mechanism implements virtualization layer assisted scrubbing for those ranks.

Figure 6:
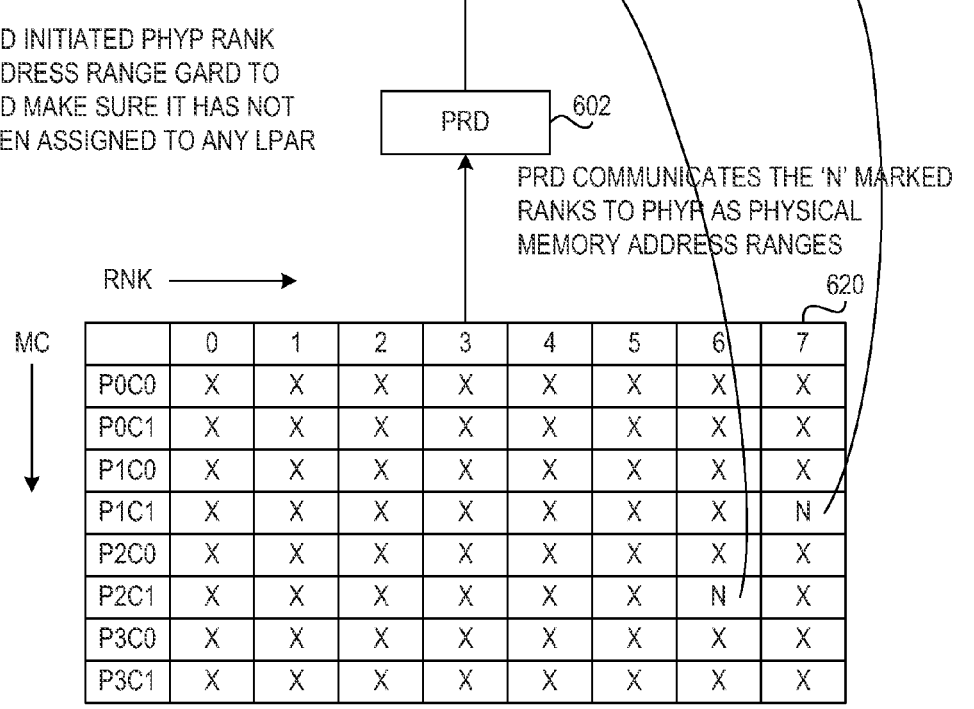
FIG. 6 is a diagram illustrating scrub coverage triggered rank gard in accordance with an illustrative embodiment.

FIG. 6 is a diagram illustrating scrub coverage triggered rank gard in accordance with an illustrative embodiment. After PRD 602 finishes the targeted scrub diagnostic, the resulting in PRD scrub coverage table 620 includes ranks marked as scrubbed (X) and ranks marked indicating that scrub coverage cannot be determined, or not scrubbed (N). The ranks marked as not scrubbed (N) are vulnerable for the operating system runtime environment. Because scrub status has not been determined for the rank, any operating system fetch would be the first time a potential fatal unrecoverable error (UE) would be exposed. To prevent this, PRD 602 communicates the physical memory address range of each rank marked as not scrubbed (N) to the Power Hypervisor (PHYP) (not shown). The PHYP converts the physical address range into PHYP virtual address map and puts the rank in a "bad" memory list in PHYP logical memory map 610. This prevents the PHYP from allocating the rank to any logical partition (LPAR).

In another embodiment, after completion of PRD targeted diagnostic, if there are certain banks that have still not been covered by hardware memory scrub, the PRD initiates PHYP driven scrub on the concerned memory controller. Thus, for each rank with scrub coverage status of "N", the PRD performs the following:

1) Turn off the hardware scrubbing on the entire memory controller.
2) PHYP assisted scrubbing now drives scrubbing and replaces hardware scrubbing forever on that particular memory controller.
3) PHYP scrub cycle time may be the same as that of hardware scrubbing so all memory of the system is in sync.
4) Remove the entire memory controller from the PRD scrub coverage table so the PRD does not spend time accounting for hardware coverage, which is disabled.

The embodiments described above may drastically improve reliability and serviceability of the system and help to formulate future memory diagnostic enhancements. Administrators would have a better idea of diagnostic coverage of memory during the scrub cycle. Scrub coverage can help some potential future intelligent diagnostic actions by the PRD. More accurate scrub coverage information would help the operating system(s) to avoid memory ranks with potential fatal UEs and improve reliability of the entire system. The embodiments have low cost and ease of implementation that make them viable and feasible features for future product enhancements.

As will be appreciated by one skilled in the art, the present invention may be embodied as a system, method, or computer program product. Accordingly, aspects of the present invention may take the form of an entirety hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart, and/or block diagram block or blocks.

Figure 7:
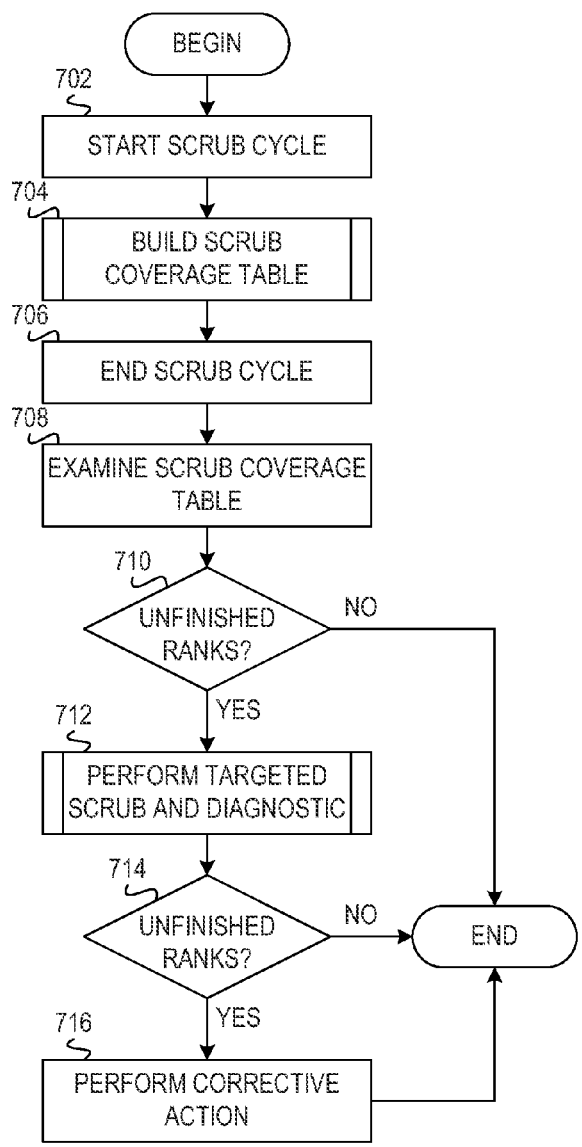
FIG. 7 is a flowchart illustrating operation of firmware monitoring of memory scrub coverage and fault isolation in accordance with an illustrative embodiment.

FIG. 7 is a flowchart illustrating operation of firmware monitoring of memory scrub coverage and fault isolation in accordance with an illustrative embodiment. Operation begins, and the processor runtime diagnostics (PRD) starts the hardware scrub cycle (block 702). The PRD builds the scrub coverage table (block 704). Details of building the scrub coverage table are described below with reference to FIGS. 8A, 8B, and 9A-9C. Then, the PRD ends the scrub cycle (block 706).

The PRD examines the scrub coverage table (block 708) and determines whether there are ranks that did not successfully complete hardware memory scrub (block 710). If all ranks completed hardware scrub successfully, then operation ends. If there are ranks that did not complete hardware scrub successfully in block 710, then the PRD performs targeted scrub and diagnostic (block 712). Details of the targeted scrub and diagnostic are described below with reference to FIG. 10.

After the targeted scrub diagnostic of block 712, the PRD determines whether there are ranks that still did not successfully complete hardware memory scrub (block 714). If all ranks completed hardware scrub successfully, then operation ends. If there are ranks that did not complete hardware scrub successfully in the targeted scrub diagnostic in block 714, then the PRD performs corrective action (block 716), and operation ends. As described above, corrective action may include logical memory block (LMB) garding by the PHYP to avoid allocating those ranks to a logical partition. Alternatively, or in addition, corrective action may include turning off hardware scrubbing for each memory controller in question and invoking PHYP assisted memory scrubbing for those memory controllers.

Figure 8A:
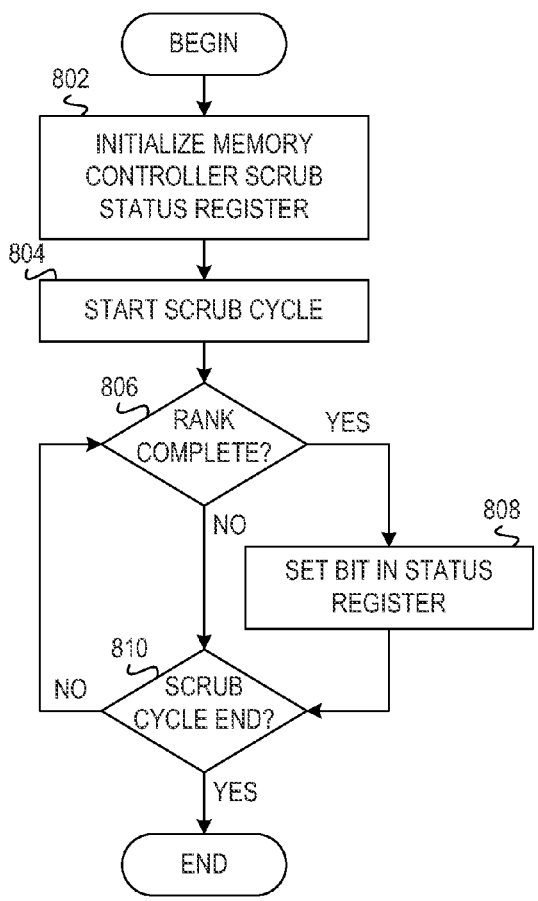
FIG. 8A is a flowchart illustrating operation of a memory controller with hardware monitoring of memory scrub coverage in accordance with an illustrative embodiment.

FIG. 8A is a flowchart illustrating operation of a memory controller with hardware monitoring of memory scrub coverage in accordance with an illustrative embodiment. Operation begins, and the memory controller initializes a memory controller scrub status register (block 802). The memory controller starts the hardware scrub cycle (block 804). The memory controller determines whether a rank completes (block 806). If a rank completes, the memory controller sets a bit in the status register corresponding to that rank (block 808). Thereafter, or if a rank does not complete in block 806, the memory controller determines whether the scrub cycle ends (block 810). If the scrub cycle does not end, operation returns to block 806 to determine whether a rank completes. If the scrub cycle ends in block 810, then operation ends.

Figure 8B:
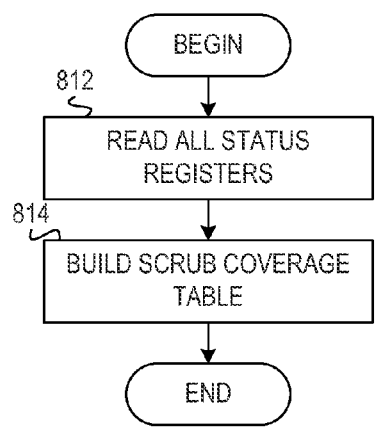
FIG. 8B is a flowchart illustrating operation of a processor runtime diagnostic with hardware monitoring of memory scrub coverage in accordance with an illustrative embodiment.

FIG. 8B is a flowchart illustrating operation of a processor runtime diagnostic with hardware monitoring of memory scrub coverage in accordance with an illustrative embodiment. Operation begins, and the processor runtime diagnostic (PRD) reads all status registers from all configured memory controllers (block 812). The PRD then builds a scrub coverage table (block 814). Thereafter, operation ends.

Figure 9A:
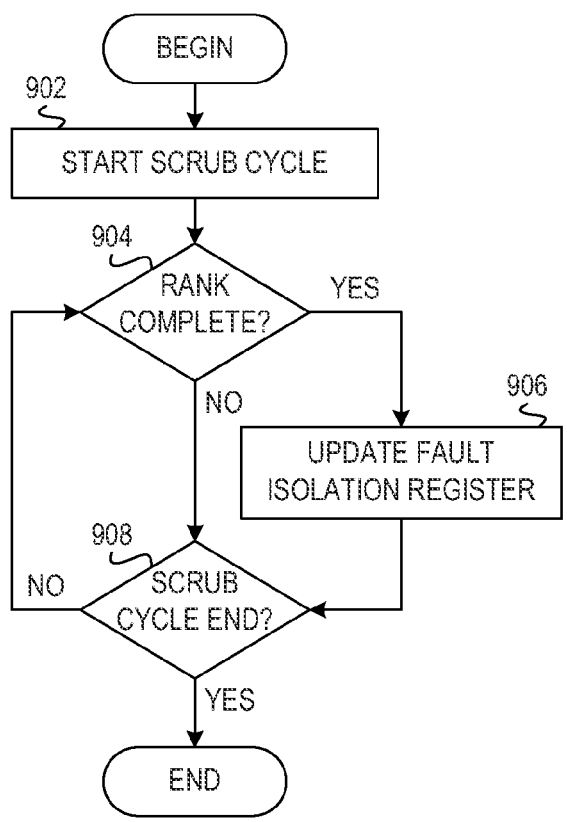
FIG. 9A is a flowchart illustrating operation of a memory controller with global firmware monitoring of memory scrub coverage in accordance with an illustrative embodiment.

FIG. 9A is a flowchart illustrating operation of a memory controller with global firmware monitoring of memory scrub coverage in accordance with an illustrative embodiment. Operation begins, and the memory controller starts a memory scrub cycle (block 902). The memory controller determines whether a rank completes (block 904). If a rank completes, the memory controller updates a memory controller fault isolation register to indicate that the memory scrub successfully scrubbed through a rank (block 906). Thereafter, or if a rank does not complete in block 904, the memory controller determines whether the scrub cycle ends (block 908). If the scrub cycle does not end, operation returns to block 904 to determine whether a rank completes. If the scrub cycle ends in block 908, then operation ends.

Figure 9B:
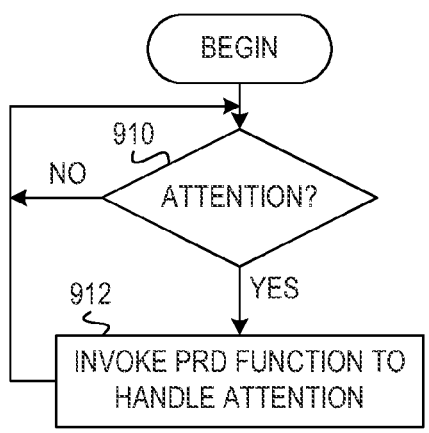
FIG. 9B is a flowchart illustrating operation of global firmware for monitoring memory scrub coverage in accordance with an illustrative embodiment.

FIG. 9B is a flowchart illustrating operation of global firmware for monitoring memory scrub coverage in accordance with an illustrative embodiment. Operation begins, and the global firmware determines whether it receives an attention responsive to the memory controller updating the fault isolation register (block 910). If the global firmware receives an attention, the global firmware invokes a PRD function to handle the attention (block 912). Thereafter, or if the global firmware does not receive an attention in block 910, operation returns to block 910 to determine whether the global firmware receives an attention.

Figure 9C:
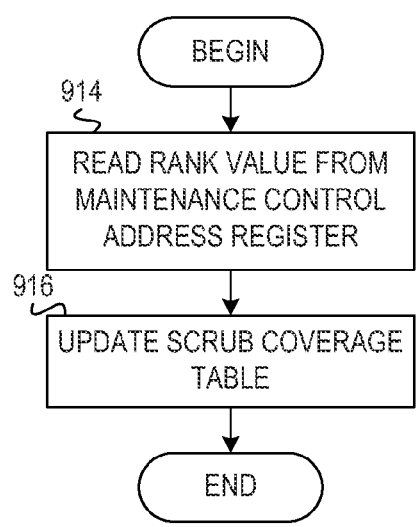
FIG. 9C is a flowchart illustrating operation of a processor runtime diagnostic with global firmware monitoring scrub coverage in accordance with an illustrative embodiment.

FIG. 9C is a flowchart illustrating operation of a processor runtime diagnostic with global firmware monitoring scrub coverage in accordance with an illustrative embodiment. Operation begins with the global firmware invoking a processor runtime diagnostic function for handling the attention, and the PRD reads the rank value from the maintenance control address register in the memory controller (block 914). The PRD updates the appropriate cell of the scrub coverage table (block 916), and operation ends.

FIG. 10 is a flowchart illustrating operation of a processor runtime diagnostic for performing a targeted memory scrub diagnostic in accordance with an illustrative embodiment. Operation begins, and the processor runtime diagnostic (PRD) examines a first memory controller (MC) in the scrub coverage table (block 1002) and examines a first rank for that memory controller (block 1004).

The PRD determines whether the scrub coverage table indicates that the rank completed memory scrub successfully (block 1006). If the rank completed successfully, the PRD determines whether the rank is the last rank for the memory controller (block 1008). If the rank is not the last rank for the memory controller, the PRD examines the next rank in the scrub coverage table (bock 1010), and operation returns to block 1006 to determine whether the rank completed memory scrub successfully. If the rank is the last rank for the memory controller in block 1008, the PRD determines whether the memory controller is the last memory controller represented in the scrub coverage table (block 1012). If the memory controller is the last memory controller, then operation ends; otherwise, the PRD examines the next memory controller in the scrub coverage table (block 1014), and operation returns to block 1004 to examine the first rank of the memory controller in the scrub coverage table.

If a given rank did not complete memory scrub successfully in block 1006, the PRD initiates a hardware scrub of that rank (block 1016). The PRD then determines whether the hardware scrub is complete for that rank (block 1018). If the hardware scrub of that rank is not complete, the PRD determines whether a timeout condition occurs (block 1020). If a timeout condition does not occur, operation returns to block 1018 to determine whether the hardware scrub is complete for the rank.

If the hardware scrub completes for the rank in block 1018 before the timeout in block 1020, then the PRD marks the rank as scrubbed in the scrub coverage table (block 1022), and operation continues to block 1008 to determine whether the rank is the last rank in the memory controller. If a timeout condition occurs in block 1020 before the hardware scrub of the rank completes in block 1018, then the PRD marks the rank as not scrubbed (N) in the scrub coverage table (block 1024), and operation continues to block 1008 to determine whether the rank is the last rank in the memory controller.

The flowcharts and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiments provide mechanisms in which firmware verifies the entire system's memory scrub coverage through some additional memory controller (MC) registers/attentions and build up a processor runtime diagnostic (PRD) scrub coverage table during every scrub cycle. Firmware may go through the scrub coverage table rank-by-rank on a periodic basis to determine whether any ranks had not been covered by hardware scrubbing. Firmware may initiate a targeted scrub and diagnostic for all of the ranks that did not have adequate scrub coverage. If for some reason the system still has some memory ranks that have not been covered by the initial hardware scrub and the targeted scrub, then the firmware may perform some course of action for fault isolation.

As noted above, it should be appreciated that the illustrative embodiments may take the form of an entirely hardware embodiment, an entirely software embodiment or an embodiment containing both hardware and software elements in one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can he coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for monitoring memory scrub coverage, the method comprising:
    initiating a hardware memory scrub cycle for performing a hardware memory scrub of a memory comprising at least one configured memory controller, wherein each memory controller is associated with a memory having a plurality of ranks;
    building a scrub coverage table for the at least one memory controller and the plurality of rank of the at least one configured memory controller by storing, for each rank for which the hardware memory scrub did successfully complete, an indication that the rank is scrubbed and storing, for each rank for which the hardware memory scrub did not successfully complete, an indication that the rank is not yet scrubbed;
    initiating a targeted scrub diagnostic for performing a targeted hardware memory scrub of each rank having an indication that the rank is not yet scrubbed in the scrub coverage table; and
    updating the scrub coverage table by storing, for each successful rank for which the targeted hardware memory scrub did successfully complete, an indication that the successful rank is scrubbed and storing, for each unsuccessful rank for which the targeted hardware memory scrub did not successfully complete before a timeout condition, an indication that the unsuccessful rank is not scrubbed after the targeted hardware memory scrub.

2. The method of claim 1, further comprising:
    performing a corrective action for each unsuccessful rank having an indication that the unsuccessful rank is not scrubbed after the targeted hardware memory scrub in the scrub coverage table.

3. The method of claim 2, wherein the corrective action comprises:
    marking the unsuccessful rank in a logical memory map; and
    preventing a virtualization layer from allocating the unsuccessful rank to a logical partition.

4. The method of claim 2, wherein the corrective action comprises:
    turning off hardware scrubbing for the memory controller associated with the unsuccessful rank;
    replacing hardware scrubbing with virtualization layer assisted scrubbing for the memory controller associated with the unsuccessful rank; and
    removing the memory controller associated with the unsuccessful rank from the scrub coverage table.

5. The method of claim 1, wherein building the scrub coverage table comprises:
    initializing a scrub status register in hardware of each of the at least one configured memory controller;
    responsive to the hardware memory scrub covering each bank in a given rank, setting a bit in the scrub status register corresponding to the given rank; and
    responsive to completion of the hardware memory scrub cycle, reading the scrub status register in hardware of each of the at least one configured memory controller.

6. The method of claim 1, wherein building the scrub coverage table comprises:
    responsive to the hardware memory scrub covering each bank in a given rank in a given memory controller, updating a fault isolation register in hardware of the given memory controller;
    responsive to updating the fault isolation register in the hardware of the given memory controller, triggering an attention to global firmware;
    responsive to the attention to global firmware, invoking a function to handle the attention;
    responsive to invoking the function to handle the attention, reading a rank value from a maintenance control address register in the hardware of the given memory controller; and
    updating a corresponding portion of the scrub coverage table to store for the given rank an indication that the rank is scrubbed.

7. A computer program product comprising a computer readable storage medium having a computer readable program stored therein, wherein the computer readable program, when executed on a computing device, causes the computing device to:
    initiate a hardware memory scrub cycle for performing a hardware memory scrub of a memory comprising at least one configured memory controller, wherein each memory controller is associated with a memory having a plurality of ranks;
    build a scrub coverage table for the at least one memory controller and the plurality of rank of the at least one configured memory controller by storing, for each rank for which the hardware memory scrub did successfully complete, an indication that the rank is scrubbed and storing, for each rank for which the hardware memory scrub did not successfully complete, an indication that the rank is not yet scrubbed;
    initiate a targeted scrub diagnostic for performing a targeted hardware memory scrub of each rank having an indication that the rank is not yet scrubbed in the scrub coverage table; and
    update the scrub coverage table by storing, for each successful rank for which the targeted hardware memory scrub did successfully complete, an indication that the successful rank is scrubbed and storing, for each unsuccessful rank for which the targeted hardware memory scrub did not successfully complete before a timeout condition, an indication that the unsuccessful rank is not scrubbed after the targeted hardware memory scrub.

8. The computer program product of claim 7, wherein the computer readable program further causes the computing device to:
perform a corrective action for each unsuccessful rank having an indication that the unsuccessful rank is not scrubbed alter the targeted hardware memory scrub in the scrub coverage table.

9. The computer program product of claim 8, wherein the corrective action comprises:
marking the unsuccessful rank in a logical memory map; and
preventing a virtualization layer from allocating the unsuccessful rank to a logical partition.

10. The computer program product of claim 8, wherein the corrective action comprises:
turning off hardware scrubbing for the memory controller associated with the unsuccessful rank;
replacing hardware scrubbing with virtualization layer assisted scrubbing for the memory controller associated with the unsuccessful rank; and
removing the memory controller associated with the unsuccessful rank from the scrub coverage table.

11. The computer program product of claim 7, wherein building the scrub coverage table comprises:
initializing a scrub status register in hardware of each of the at least one configured memory controller; and
responsive to completion of the hardware memory scrub cycle, reading the scrub status register in hardware of each of the at least one configured memory controller.

12. The computer program product of claim 7, wherein building the scrub coverage table comprises:
responsive to global firmware invoking a function to handle an attention triggered by hardware of a given memory controller updating a fault isolation register to indicate that the hardware memory scrub has covered each bank in a given rank in the given memory controller, reading a rank value from a maintenance control address register in the hardware of the given memory controller; and
updating a corresponding portion of the scrub coverage table to store for the given rank an indication that the rank is scrubbed.

13. The computer program product of claim 7, wherein the computer readable program is stored in a computer readable storage medium in a data processing system and wherein the computer readable program was downloaded over a network from a remote data processing system.

14. The computer program product of claim 7, wherein the computer readable program is stored in a computer readable storage medium in a server data processing system and wherein the computer readable program is downloaded over a network to a remote data processing system for use in a computer readable storage medium with the remote system.

15. An apparatus, comprising:
a processor; and
a memory comprising at least one configured memory controller, wherein each memory controller is associated with a memory having a plurality of ranks, wherein the processor is configured to:
initiate a hardware memory scrub cycle for performing a hardware memory scrub of the memory;
build a scrub coverage table for the at least one memory controller and the plurality of ranks of the at least one configured memory controller by storing, for each rank for which the hardware memory scrub did successfully complete, an indication that the rank is scrubbed and storing, for each rank for which the hardware memory scrub did not successful complete, an indication that the rank is not yet scrubbed;
initiate a targeted scrub diagnostic for performing a targeted hardware memory scrub of each rank having an indication that the rank is not yet scrubbed in the scrub coverage table; and
update the scrub coverage table by storing, for each successful rank for which the targeted hardware memory scrub did successfully complete, an indication that the successful rank is scrubbed and storing, for each unsuccessful rank for which the targeted hardware memory scrub did not successfully complete before a timeout condition, an indication that the unsuccessful rank is not scrubbed after the targeted hardware memory scrub.

16. The apparatus of claim 15, wherein the processor is further configured to:
perform a corrective action for each unsuccessful rank having an indication that the unsuccessful rank is not scrubbed after the targeted hardware memory scrub in the scrub coverage table.

17. The apparatus of claim 16, wherein the corrective action comprises:
marking the unsuccessful rank in a logical memory map; and
preventing a virtualization layer from allocating the unsuccessful rank to a logical partition.

18. The apparatus of claim 16, wherein the corrective action comprises:
turning off hardware scrubbing for the memory controller associated with the unsuccessful rank;
replacing hardware scrubbing with virtualization layer assisted scrubbing for the memory controller associated with the unsuccessful rank; and
removing the memory controller associated with the unsuccessful rank from the scrub coverage table.

19. The apparatus of claim 15, wherein building the scrub coverage table comprises:
initializing a scrub status register in hardware of each of the at least one configured memory controller;
responsive to the hardware memory scrub covering each bank in a given rank, setting a bit in the scrub status register corresponding to the given rank; and
responsive to completion of the hardware memory scrub cycle, reading the scrub status register in hardware of each of the at least one configured memory controller.

20. The apparatus of claim 15, wherein building the scrub coverage table comprises:
responsive to the hardware memory scrub covering each bank in a given rank in a given memory controller, updating a fault isolation register in hardware of the given memory controller;
responsive to updating the fault isolation register in the hardware of the given memory controller, triggering an attention to global firmware;
responsive to the attention to global firmware, invoking a function to handle the attention;
responsive to invoking the function to handle the attention, reading a rank value from a maintenance control address register in the hardware of the given memory controller; and
updating a corresponding portion of the scrub coverage table to store for the given rank an indication that the rank is scrubbed.

* * * * *